(12) United States Patent
Masui et al.

(10) Patent No.: US 8,900,901 B2
(45) Date of Patent: Dec. 2, 2014

(54) NITRIDE SEMICONDUCTOR LASER ELEMENT

(75) Inventors: Shingo Masui, Anan (JP); Tomonori Morizumi, Anan (JP)

(73) Assignee: Nichia Corporation, Anan-shi (JP)

( * ) Notice: Subject to any disclaimer, the term of this patent is extended or adjusted under 35 U.S.C. 154(b) by 648 days.

(21) Appl. No.: 12/814,132

(22) Filed: Jun. 11, 2010

(65) Prior Publication Data
US 2010/0248406 A1    Sep. 30, 2010

Related U.S. Application Data

(62) Division of application No. 11/963,822, filed on Dec. 22, 2007, now Pat. No. 7,773,650.

(30) Foreign Application Priority Data

Dec. 28, 2006  (JP) ................................. 2006-354634
Dec. 11, 2007  (JP) ................................. 2007-319099

(51) Int. Cl.
| | |
|---|---|
| H01L 21/20 | (2006.01) |
| H01S 5/22 | (2006.01) |
| B82Y 20/00 | (2011.01) |
| H01L 21/02 | (2006.01) |
| H01S 5/028 | (2006.01) |
| H01S 5/20 | (2006.01) |
| H01S 5/30 | (2006.01) |
| H01S 5/343 | (2006.01) |

(52) U.S. Cl.
CPC . *H01S 5/22* (2013.01); *B82Y 20/00* (2013.01); *H01L 21/0254* (2013.01); *H01L 21/02576* (2013.01); *H01L 21/02579* (2013.01); *H01S 5/0282* (2013.01); *H01S 5/2009* (2013.01); *H01S 5/2214* (2013.01); *H01S 5/3063* (2013.01); *H01S 5/34333* (2013.01); *H01S 2304/04* (2013.01)
USPC .......................... 438/38; 438/39; 257/E21.09

(58) Field of Classification Search
USPC ..................................... 438/22–42
See application file for complete search history.

(56) References Cited

U.S. PATENT DOCUMENTS

| 6,597,716 B1 | 7/2003 | Takatani |
|---|---|---|
| 6,768,755 B2 | 7/2004 | Inoue et al. |

(Continued)

FOREIGN PATENT DOCUMENTS

| JP | H09-283845 A | 10/1997 |
|---|---|---|
| JP | H10-270792 A | 10/1998 |

(Continued)

*Primary Examiner* — Savitr Mulpuri
(74) *Attorney, Agent, or Firm* — Global IP Counselors, LLP

(57) ABSTRACT

A method is for manufacturing a nitride semiconductor laser element including a substrate, a nitride semiconductor layer that is laminated on the substrate and that has a ridge on its surface, an insulating protective film, and an electrode that is electrically connected with the nitride semiconductor layer. The method includes forming the ridge; forming a monocrystalline first film from the side faces of the ridge to the nitride semiconductor layer on both sides of the ridge; and forming a second film containing polycrystalline or an amorphous substance over the first film thereby forming the insulating protective film.

18 Claims, 8 Drawing Sheets

(56) References Cited

U.S. PATENT DOCUMENTS

| | | |
|---|---|---|
| 6,795,480 B1 * | 9/2004 | Kaya et al. .................. 372/99 |
| 2004/0159848 A1 | 8/2004 | Yamaguchi et al. |
| 2005/0170542 A1 * | 8/2005 | Matsumura ................. 438/31 |
| 2005/0281304 A1 | 12/2005 | Mochida |
| 2007/0014323 A1 * | 1/2007 | Tachibana et al. ......... 372/46.01 |
| 2007/0025231 A1 | 2/2007 | Ochiai et al. |
| 2007/0037305 A1 * | 2/2007 | Murayama ................. 438/22 |

FOREIGN PATENT DOCUMENTS

| | | |
|---|---|---|
| JP | 2000-332290 A | 11/2000 |
| JP | 2001-284728 A | 10/2001 |
| JP | 2005-064262 A | 3/2005 |
| JP | 2005-303272 A | 10/2005 |
| JP | 2006-024703 A | 1/2006 |

* cited by examiner $Al_2O_3$[0001] Incidence

GaN[10-10] Incidence

NITRIDE SEMICONDUCTOR LASER ELEMENT

CROSS-REFERENCE TO RELATED APPLICATIONS

This application is a divisional application of U.S. patent application Ser. No. 11/963,822 filed on Dec. 22, 2007. Also, this application claims priority to Japanese Patent Application No. 2006-354634, filed on Dec. 28, 2006, and Japanese Patent Application No. 2007-319099, filed on Dec. 11, 2007. The entire disclosures of U.S. patent application Ser. No. 11/963,822 and Japanese Patent Application Nos. 2006-354634 and 2007-319099 are hereby incorporated herein by reference.

BACKGROUND OF THE INVENTION

1. Field of the Invention

The present invention relates to a nitride semiconductor laser element, and more particularly relates to a nitride semiconductor laser element having a ridge waveguide structure.

2. Background Information

A nitride semiconductor is formed from a semiconductor compound containing $In_xAl_yGa_{1-x-y}N$ ($0 \leq x$, $0 \leq y$, $0 \leq x+y \leq 1$), and there has been growing demand for semiconductor laser elements that make use of this material in optical disk systems that allow large quantities of information to be recorded and reproduced in high density (such as next-generation DVDs), and in personal computers and other such electronic devices. Considerable research has therefore gone into semiconductor laser elements that make use of nitride semiconductors.

Also, it is believed that semiconductor laser elements that make use of nitride semiconductors are capable of emission over a wide range of visible light wavelengths, from ultraviolet to red, so such elements are expected to find use in many different applications, such as laser printers, laser displays, optical network light sources, and so forth.

In particular, there have been various studies into the structure of semiconductor laser elements, and there have been proposals for structures that allow favorable lateral mode control, structures that affords lower power consumption, higher output, higher reliability, smaller size, longer service life, etc., and so forth. Of these, a structure that holds particular promise is one with a ridge waveguide structure. With a semiconductor laser element having such a structure, a protective film is usually formed from the side faces of the ridge to the surface of the nitride semiconductor layer on both sides of the ridge, in order to achieved optical confinement (see, for example, Japanese Laid-Open Patent Application H09-283845, H10-270792 and 2006-24703).

An insulating protective film such as this is selected after taking into account such factors as adhesion and the difference in refractive index from that of the nitride semiconductor layer.

However, even when a protective film is selected by taking the refractive index into account, this protective film may not necessarily have good adhesion with the nitride semiconductor layer. Also, even if a protective film with good adhesion to the nitride semiconductor layer is selected, optical confinement may not be good. Therefore, forming a protective film that continues to function well throughout extended continuous drive in terms of both adhesion and optical confinement is necessary for a nitride semiconductor laser element.

SUMMARY OF THE INVENTION

The present invention was conceived in light of the above problems, and it is an object thereof to provide a nitride semiconductor laser element in which good optical confinement is attained in a nitride semiconductor laser element, while at the same time good adhesion can be ensured between the nitride semiconductor layer and the protective film on both sides of the ridge, and this in turn enhances the optical output characteristics with respect to input current, and makes it possible to obtain a nitride semiconductor laser element that exhibits a long service life and a low threshold.

The present invention provides a method for manufacturing a nitride semiconductor laser element including a substrate, a nitride semiconductor layer that is laminated on the substrate and that has a ridge on its surface, an insulating protective film, and an electrode that is electrically connected with the nitride semiconductor layer. The method includes forming the ridge; forming a monocrystalline first film from the side faces of the ridge to the nitride semiconductor layer on both sides of the ridge; and forming a second film containing polycrystalline or an amorphous substance over the first film thereby forming the insulating protective film.

With the present invention, good optical confinement is attained in a nitride semiconductor laser element, while at the same time stress can be minimized between the nitride semiconductor layer and the protective film on both sides of the ridge, and good adhesion can be ensured. As a result, cracking of the nitride semiconductor layer and peeling of the protective film can be prevented, and this in turn enhances the optical output characteristics with respect to input current, and makes it possible to obtain a nitride semiconductor laser element that exhibits a long service life and a low threshold.

DETAILED DESCRIPTION OF THE PREFERRED EMBODIMENTS

A nitride semiconductor laser element of the present invention primarily comprises a substrate, a nitride semiconductor layer, electrodes and an insulating protective film.

An insulating protective film is also called an embedded film, and is usually formed over the surface of the nitride semiconductor layer and/or the side faces of the ridge. That is, it is formed on the nitride semiconductor layer, in a region other than the region where the nitride semiconductor layer is in direct contact with the electrode (discussed below) and thereby electrically connected. There are no particular restrictions on the position, size, shape, etc., of the region of connection between the nitride semiconductor layer and the electrode, but an example is part of the surface of the nitride semiconductor layer, such as a portion extending from substantially the entire surface of the upper face of the stripe-shaped ridge formed on the surface of the nitride semiconductor layer, and/or from substantially the entire surface of the ridge upper face, to both sides thereof. The term "insulating" here means that current can flow selectively from a contact region between the nitride semiconductor region constituting the ridge and the electrode during drive of the nitride semiconductor laser element. However, this insulating protective film may be one that conducts current as long as it is low enough not to cause short-circuiting.

Figure 9A:
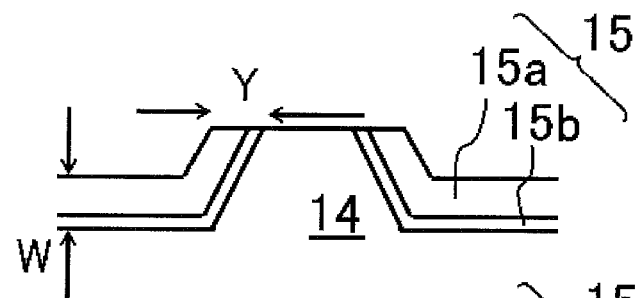
FIGS. 9A to 9E are simplified cross section views illustrating the laminating structure of the insulating protective film of the present invention.
Figure 9B:
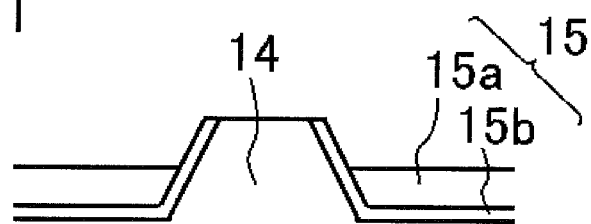
Figure 9C:
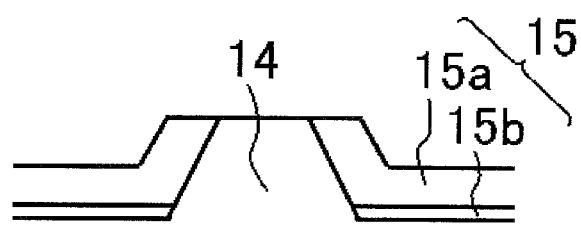
Figure 9D:
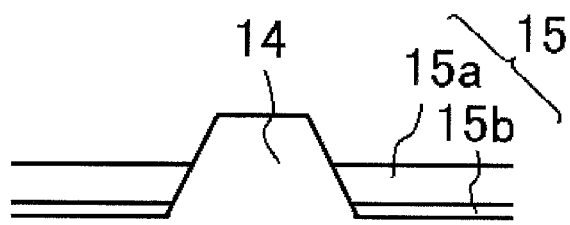

An insulating protective film is generally formed from an insulating material whose refractive index is smaller than that of the nitride semiconductor layer. More specifically, the refractive index is favorably 2.4 or less. The refractive index can be measured with a spectral ellipsometer that makes use of ellipsometry (more specifically, using an HS-190 made by J.A. Woollam, for example). For instance, an insulating protective film can comprise a multilayer film produced by forming a monocrystalline first film and a polycrystalline or amorphous second film, in that order, on a nitride semiconductor layer. More specifically, as shown in FIGS. 9a to 9d, regardless of whether or not the side faces of the ridge are completely covered, examples include a state in which a first film 15b is laminated so as to be partially exposed from a second film 15a (FIGS. 9a and 9b), and a state in which the first film 15b is laminated completely covering the second film 15a (FIGS. 9c and 9d). Example of the insulating protective film include oxides, nitride or oxide-nitride of Zr, Si, V, Nb, Hf, Ta, Al, Ce, In, Sb, Zn and other such oxides, nitride or oxide-nitride. If the insulating protective film is formed from the side faces of the ridge to the nitride semiconductor surface on both sides of the ridge, this will ensure a difference in the refractive index with respect to the nitride semiconductor layer, and particularly the p-side semiconductor layer, and allow the leakage of light from the active layer to be controlled. It also allows light to be efficiently confined within the ridge, better ensures insulation near the bottom part of the ridge, and avoids the generation of leak current.

For this effect to be satisfactorily realized, adhesion to the nitride semiconductor layer needs to be good, without stress being produced. To accomplish this, it is necessary to minimize the stress and ensure good adhesion between the nitride semiconductor layer and the insulating protective film on both sides of the ridge, and thereby prevent cracking of the nitride semiconductor layer and peeling of the insulating protective film. With the present invention, by forming the above-mentioned first film and then the second film over a nitride semiconductor layer, it is possible to suppress the stress that is produced by a difference in the lattice constants or coefficients of thermal expansion between the nitride semiconductor layer and the insulating protective film.

The first film may be a monocrystalline film composed of an insulator or a dielectric. Thus forming a monocrystalline film allows for uniform orientation according to the crystals of the nitride semiconductor, and allows stress in the nitride semiconductor layer to be minimized. In particular, if the nitride semiconductor layer is formed by $In_xAl_yGa_{1-x-y}N$ ($0 \leq x$, $0 \leq y$, $0 \leq x+y \leq 1$), it is preferable to orientate a first film with [1-210] and [10-10] with respect to $In_xAl_yGa_{1-x-y}N$ [0002] and $In_xAl_yGa_{1-x-y}N$ (e.g., GaN) [11-20], respectively. Further, if the nitride semiconductor layer is formed by GaN, it is preferable to orientate a first film with [1-210] and [10-10] with respect to GaN[0002] and [11-20], respectively. In other words, it is preferable to form a first film with an A axis with respect to a nitride semiconductor layer with a C axis. It is preferable for the first film to be aluminum oxides (e.g., $Al_2O_3$), gallium oxides or aluminum nitrides, for example. It is more preferable for the first film to be aluminum oxide and for this $Al_2O_3$ formed over the nitride semiconductor layer to contain crystals with A axis orientation or M axis orientation with respect to the C plane that is the surface of the nitride semiconductor layer. From another standpoint, the first film preferably contains hexagonal crystals. A typical example of hexagonal crystals is the crystal structure of AlN.

The second film may be a polycrystalline or amorphous film composed of an insulator or a dielectric. Example of the second film includes zirconium oxide (e.g., $ZrO_2$), silicon oxide (e.g., $SiO_2$) or oxides. Also, a film may be used which can be made into a polycrystalline or amorphous film, depending on the film production method. The second film may also have a laminated structure, in which case the laminated structure may consist of films that are different in one or more categories, such as material, composition, crystal system, or film production method. When the first film is $Al_2O_3$, it is preferable for the second film to be $ZrO_2$ because adhesion will be better.

The crystallinity of the first and second films here can be easily ascertained from a diffraction image produced by electron beam. In general, a material is classified as monocrystalline, polycrystalline, or amorphous according to its degree of crystallization. There is almost no difference in lattice constant and the lattice planes have almost no inclination in monocrystalline material. In other words, the atoms of such materials are arranged in a regular layout and order is maintained over a long distance, so there is almost no fluctuation in lattice constant and almost no lattice plane inclination. A polycrystalline material consists of numerous microscopic monocrystals, or, to put it another way, it is made up of microcrystals. An amorphous material does not have a periodic structure as is found in crystals, that is, its atomic arrangement is irregular and there is no long-distance order.

Figure 8A:
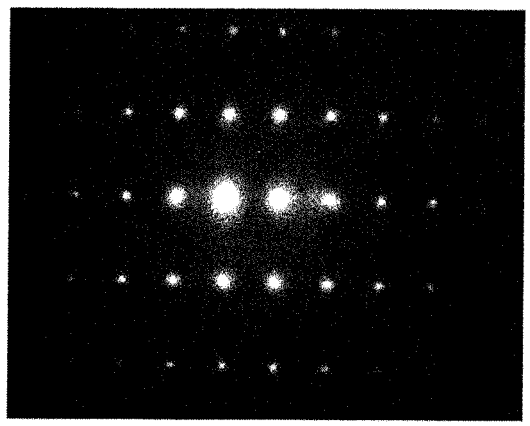
FIGS. 8A, 8B and 8C are electron beam diffraction images in order to describe a crystallinity of the material.
Figure 8B:
Figure 8C:
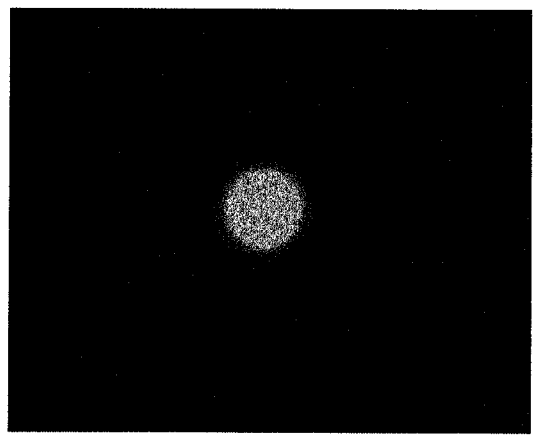

It is known that when these materials are irradiated with an electron beam, an electron beam diffraction image appears with good regularity according to the magnitude of the lattice constant and the planar orientation. For example, in the case of a monocrystal, since the crystal planes are substantially aligned, the diffraction points line up regularly as shown in FIG. 8A. With a polycrystalline material, since it is made up of microcrystals, the orientations of the various lattice planes are not aligned, and Debye rings are seen, or the diffraction points are jumbled, as shown in FIG. 8B. With an amorphous material, meanwhile, since the atomic arrangement is not periodic over a long distance, electron beam diffraction does not occur. Therefore, the diffraction image has not diffraction points, as seen in FIG. 8C.

The first film is preferably thinner than the second film, as this will effectively reduce stress in the protective film. It is favorable for the insulating protective film to have the total thickness of 1000 to 5000 Å. If the total thickness of this protective film is 1000 Å or more, it will have an optical confinement effect, and optical absorption by an electrode can be prevented. Also, if the total thickness of this protective film is 5000 Å or less, this will reduce protective film peeling and cracking caused by stress. It is favorable for the first film to have a thickness that is about 5 to 30%, and preferably about 7 to 20%, of the insulating protective film thickness. More specifically, it is suitable for the first film to have a thickness of 1000 Å or less, and 500 Å or less.

Figure 9E:
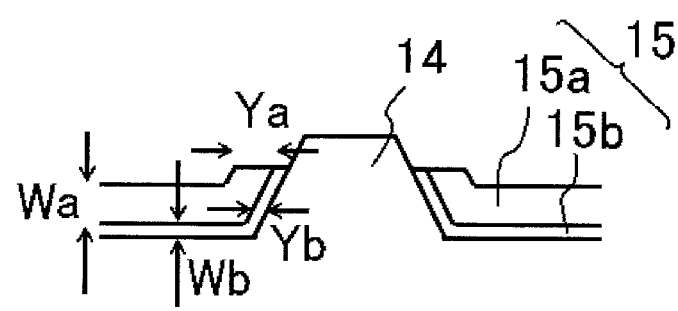

Since the insulating protective film is usually formed on the ridge side faces and the nitride semiconductor layer surface, there may be a difference in the thickness between these two locations depending on the film formation apparatus, method, and so forth. For example, as shown in FIGS. 9a and 9e, the ratio between the height W (Wb and Wa) and width Y (Yb and Ya) of the insulating protective film and the first film or second film is about 1:1 to 2:1, and preferably about 2:1. That is, the width Y can be about half the height W.

For example, with a multilayer film that forms an insulating protective film, if the first film that is in contact with the nitride semiconductor layer is a polycrystalline or amorphous laminated film, adhesion with the nitride semiconductor layer will be inadequate and the protective film will peel off. If this happens, the nitride semiconductor laser element may not have a sufficiently long service life. When the protective film is constituted by monocrystalline structure, the stress between the protective film and the nitride semiconductor layer increases. Consequently, if the film is formed in the desired thickness, cracks will develop in the nitride semiconductor layer, or the nitride semiconductor laser element will degrade more quickly. On the other hand, such problems can be eliminated by the constitution of the present invention, in which a protective film comprising a monocrystalline first film and a polycrystalline or an amorphous second film combined in that order is laminated from the nitride semiconductor layer side.

This insulating protective film can be formed by any method that is known in this field. For instance, a variety of methods can be used, such as vapor deposition, sputtering, reactive sputtering, ECR (Electron Cyclotron Resonance) plasma sputtering, magnetron sputtering, ion beam assist deposition, ion plating, laser ablation, CVD (Chemical Vapor Deposition), spraying, spin coating, dipping, a combination of these 2 or more methods, a combination of these methods and oxidation (thermal treatment), or the like.

In particular, to obtain a monocrystalline film, it is good to use ECR plasma sputtering. As to the film formation conditions, with an oxide film, it is favorable to use an oxygen flow that will allow adequate oxidation of the surface of the target, composed of the raw material of the monocrystalline film, during film formation. For instance, when the microwave power is 300 to 800 W, the RF power is 300 to 800 W, and the argon flow is 10 to 40 sccm, it is preferable to use an oxygen flow of 10 to 20 sccm. Also, to obtain a nitride film, when the microwave power is 300 to 800 W, the RF power is 300 to 800 W, and the argon flow is 10 to 40 sccm, it is preferable to use an nitrogen flow of 5 to 20.

To obtain a polycrystalline or amorphous film, it is favorable to use ECR plasma sputtering and film formation conditions such that the oxygen flow will not allow oxidation of the surface of the target, composed of a polycrystalline or amorphous raw material, during film formation. For instance, when the microwave power is 300 to 800 W, the RF power is 300 to 800 W, and the argon flow is 10 to 40 sccm, it is preferable to use an oxygen flow of 3 to 8 sccm.

Figure 1A:
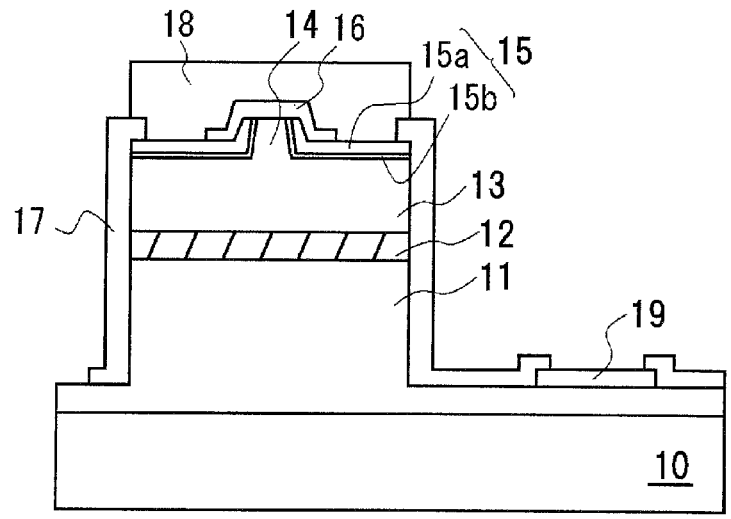
FIGS. 1A and 1B are simplified cross sections illustrating the structure of the laser elements of the present invention.

As shown in FIG. 1A, for example, the nitride semiconductor laser element of the present invention is such that an n-side semiconductor layer 11, an active layer 12, and a p-side semiconductor layer 13 are formed in that order as the nitride semiconductor layer on a substrate 10 having two main faces (a first main face and a second main face). A ridge 14 is formed on the surface of the nitride semiconductor, and the above-mentioned insulating protective film 15 is formed in a two-layer structure (a first film 15b and a second film 15a) from the side faces of the ridge 14 to the surface of the nitride semiconductor layer.

A p-side electrode 16 is formed on the top face of the ridge 14. Also, part of the nitride semiconductor layer is removed in the thickness direction, and an n-side electrode 19 is formed so as to be in contact with the n-side semiconductor laser 11. Another protective film 17 for protecting the nitride semiconductor layer is formed from the side faces of the nitride semiconductor layer up to the top face. A p-side pad electrode 18 is formed on the top faces of the insulating protective film 15, the p-side electrode 16, and the protective film 17.

Figure 1B:
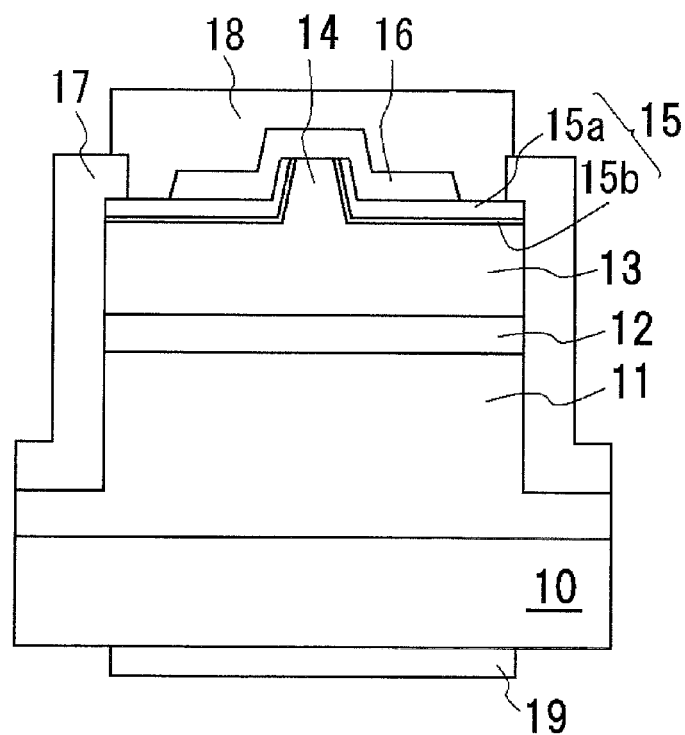

As shown in FIG. 1B, in another aspect of the nitride semiconductor laser element of the present invention, the p-side electrode 16 and the n-side electrode 19 are formed on different main faces of the substrate 10. For example, the n-side semiconductor layer 11, the active layer 12, and the p-side semiconductor layer 13 are formed in that order on a first main face of the substrate 10, and the p-side electrode 16 is formed over the p-side semiconductor layer 13. The n-side electrode 19 is formed on the second main face of the substrate 10.

The nitride semiconductor laser element of the present invention may emits laser light with a wavelength of about 420 nm or less, in particular, it is advantageous when it is an element that emits laser light with a wavelength of about 420 nm or less. That is, an oxide film (such as $ZrO_2$) that is commonly used as an insulating protective film has weak bonding strength between the oxygen and the other elements that make up the oxide film, so it is thought that the oxygen will readily bond with the elements (such as gallium) that make up the nitride semiconductor, and as a result, this will have an adverse effect on optical confinement and/or adhesion of the insulating protective film, and the drive current of the laser element will be unstable (see Comparative Example 3, for example). Under irradiation with light of about 420 nm or less (such as UV rays), the oxygen in a polycrystalline or amorphous insulating protective film is readily ionized, and destabilizes the drive current. With the present invention, this is dealt with by forming a first film between this oxide film and the nitride semiconductor layer, which moderates the irradiation with light having a wavelength of 420 nm or less, and effectively prevents the above-mentioned ionization of oxygen that would otherwise be caused by irradiation of light with this wavelength.

In the present invention, the substrate 10 may be an insulating substrate or a conductive substrate. The substrate is, for example, preferably a nitride semiconductor substrate having an off angle of no more than 10° and greater than 0° to the first main face and/or the second main face. The thickness of the substrate is at least 50 μm and no more than 10 mm, for example. A commercially available substrate, any of the various known substrates disclosed, for instance, in Japanese Laid-Open Patent Application 2006-24703, or the like may be used.

The nitride semiconductor substrate can be formed by a vapor phase growth method such as MOCVD, HYPE, MBE, or the like, a hydrothermal synthesis method in which crystals are grown in a supercritical fluid, a high pressure method, a flow method, a melt method, or the like.

The nitride semiconductor layer may include a layer having a general formula of $In_xAl_yGa_{1-x-y}N$ ($0 \leq x \leq 1$, $0 \leq y \leq 1$, $0 \leq x+y \leq 1$). In addition to this, it may be used the semiconductor layer which is partly substituted with B as a group III element, or is substituted a part of N as a group V element with P or As. The n-side nitride semiconductor layer may doped with at least one n-type impurity of IV or VI group elements, such as Si, Ge, Sn, S, O, Ti, Zr, Cd etc. and the p-side nitride semiconductor layer may doped with at least one p-type impurity, such as Mg, Zn, Be, Mn, Ca, Sr etc. The doped concentration is, for example, about $5 \times 10^{16}/cm^3$ to about $1 \times 10^{21}/cm^3$. All of layers in the n-type or p-type nitride semiconductor layers may not necessarily contain n-type or p-type impurity.

The active layer may be a multiple quantum well or single quantum well structure.

The nitride semiconductor layer may has a structure which is a SCH (Separate Confinement Heterostructure) wherein an optical waveguide is constituted by providing n-side and p-side optical guide layers above and below the active layer. However, there is no particular restriction on these structures.

There is no particular restriction on a growth method of the nitride semiconductor layer, it can be formed by means of any known method which can grow these nitride semiconductor layers, such as MOVPE (Metal Organic Vapor Phase Epitaxy), MOCVD (Metal Organic Chemical Vapor Deposition), HVPE (Hydride Vapor Phase Epitaxy), MBE (Molecular Beam Epitaxy), or the like. In particular, MOCVD and MBE are preferable because it allows the nitride semiconductor to be growth with good crystallinity.

A ridge is formed on the surface of the p-side nitride semiconductor layer. The ridge functions as an optical waveguide, the width of the ridge may be from 1.0 to 30.0 µm and preferably from 1.0 to 3.0 µm. The height of the ridge (the etching depth) may be suitably adjusted according to the thickness and material of a layer constituting p-side semiconductor layer, an extent of light confinement and the like, and, for example, may be from 0.1 to 2 µm. The ridge is preferably set so as to be 100 to 1000 µm of cavity length. The ridge need not be all the same width in the extension direction of the cavity, and its side faces may be vertical or may be tapered with an angle of about 45 to 90°.

The ridge can be formed by any method that is ordinarily used in this field. Examples include photolithography and etching. The etching here may be dry etching (such as RIE: Reactive Ion Etching) or wet etching, or both may be performed, either in this order or the other way around. It is especially favorable for the surface of the nitride semiconductor to be dry etched and then wet etched. Forming the ridge in this way allows an insulating protective film composed of the above-mentioned first film and second film to be formed.

The electrodes in the present invention refer to a pair of electrodes electrically connected to the p- and n-side nitride semiconductor layers. The p-side electrode is preferably formed over the nitride semiconductor layer and the insulating protective film. Separation of the first film can be prevented by continuously forming the electrode over the first film of the insulating protective film and the nitride semiconductor layer (the outermost layer). Separation of the insulating protective film can be prevented particularly effectively if the p-side electrode is formed up to the surface of the insulating protective film formed on the ridge side faces.

The electrodes may preferably be formed with a monolayer or multilayer film of a metal or metal alloy of palladium, platinum, nickel, gold, titanium, tungsten, cupper, silver, zinc, tin, indium, aluminum, iridium, rhodium, ITO (Indium Tin Oxide) or the like. The electrodes are suitable formed in a thickness of, for example, about 500 to about 5000 Å depend on the material used. The electrodes may be formed at least on the p-side semiconductor layer and the n-side semiconductor layer or the substrate, respectively, and further may be formed pad electrodes thereon with a conductive layer of monolayer or multilayer.

A protective film is preferably formed over the insulating protective film. This protective film may be disposed at least over the insulating protective film at the nitride semiconductor layer surface, and preferably further covers the side faces of the nitride semiconductor layer and/or the side faces or surface of the substrate, for example, with or without the insulating protective film being interposed. The protective film can be formed from the same materials as those listed as examples for the insulating protective film. This not only provides insulation, but also effectively protects the exposed side faces or surface of the nitride semiconductor layer, for example.

A reflective mirror may be formed on the cavity end faces. This reflective minor is a dielectric multilayer film composed of oxides, nitrides or oxide-nitride such as $SiO_2$, $ZrO_2$, $TiO_2$, $Al_2O_3$, $Nb_2O_5$, SiN, AlN, SiON, AlON or the like. The reflective mirror is preferably formed on the light exit side and/or the light reflecting side of the cavity face. It is preferably formed on both the light exit side (the light exit face) and the light reflecting side of the cavity face. The reflective mirror can be formed with better reproducibility if the cavity face has been formed by cleavage.

Examples of the nitride semiconductor laser element of the present invention will now be described in detail through reference to the drawings, but the present invention is not limited to or by the following examples.

Example 1

As shown in FIG. 1A, the nitride semiconductor laser element in this example is such that an n-side semiconductor layer 11, an active layer 12, and a p-side semiconductor layer 13 are formed in that order as the nitride semiconductor layer over a substrate 10, and a ridge 14 is formed on the surface of the p-side semiconductor layer 13. An insulating protective film 15 composed of a first film 15b (a monocrystalline $Al_2O_3$ film) and a second film 15a (polycrystalline or amorphous $ZrO_2$) is formed from the side faces of the ridge 14 to the surface of the nitride semiconductor layer.

The p-side electrode 16 is formed on the top face of the ridge 14. Also, part of the nitride semiconductor layer is removed in the thickness direction, and the n-side electrode 19 is formed so as to be in contact with the n-side semiconductor laser 11. The protective film 17 for protecting the element is formed from the side faces of the nitride semiconductor layer up to the top face. The p-side pad electrode 18 is formed on the top faces of the insulating protective film 15, the p-side electrode 16, and the protective film 17.

This laser element can be manufactured by the following method.

Substrate

First, a substrate 10 is readied which is composed of sapphire and in which the C plane serves as the growth plane for the nitride semiconductor layer. This substrate is conveyed into an MOVPE reaction vessel, and a buffer layer composed of GaN is grown in a thickness of 200□ at a growth temperature of 800° C. or lower using trimethyl gallium (TMG) and ammonia ($NH_3$) as the raw material gas.

N-Side Semiconductor Layer 11

The temperature is set to 1050° C., a layer composed of $Al_{0.02}Ga_{0.98}N$ doped with Si at $3 \times 10^{18}/cm^3$ (4.5 µm thick) is grown using TMG, trimethyl aluminum (TMA), and ammonia ($NH_3$) for the raw material gas with a silane gas for an impurity gas. This layer may be n-side contact layer.

Next, a layer composed of $In_yGa_{1-y}N$ (0<y≤1) doped with Si at $3 \times 10^{18}/cm^3$ (1500 Å thick) is grown using trimethyl indium (TMI), TMG, $NH_3$ for the raw material gas with a silane gas for an impurity gas.

Then, the temperature is set to 1050° C., and an A layer composed of undoped $Al_{0.16}Ga_{0.84}N$ (25 Å thick) is grown using TMA, TMG, and ammonia for the raw material, and then a B layer composed of GaN doped with Si at $1\times10^{19}/cm^3$ (25 Å thick) is laminated using a silane gas for an impurity gas. The A layer and the B layer are alternately laminated, and this process is repeated to grow an n-side clad layer composed of a multilayer film (superlattice structure) with a total thickness of 1.2 μm. No fine cracks developed in the n-side clad layer, which means that cracking was prevented well.

Next, the temperature is set to 1050° C., an n-side wave guide layer composed of undoped GaN (750 Å thick) is grown using TMG and ammonia for the raw material.

Active Layer 12

The temperature is set to 880° C., a barrier layer composed of $In_{0.01}Ga_{0.99}N$ doped with Si at $5\times10^{18}/cm^3$ (100 Å thick) and the temperature is set to 820° C., a well layer composed of undoped $In_{0.1-0.3}Ga_{0.9-0.7}N$ (50 Å thick) are laminated on the barrier layer, and an intermediate layer composed of $Al_{0.3}Ga_{0.7}N$ (10 Å thick) is grown using TMA for the raw material at the same temperature. This 3 layers forming process is repeated 2 times, finally the barrier layer is formed on the layers to grow an active layer 12 composed of a multilayer film (multi quantum well structure) with a total thickness of 580 Å.

P-Side Semiconductor Layer 13

A p-side cap layer composed of p-AlGaN doped with Mg at $1\times10^{20}/cm^3$ (100 Å thick) is grown on the active layer using $Cp_2Mg$ (bis-cyclopentadienyl magnesium), and then the temperature is set to 1050° C., and $Cp_2Mg$ and TMA are stopped, a p-side wave guide layer composed of undoped GaN (0.1 μm thick) is grown. This p-side wave guide layer is undoped layer, but magnesium may be included by diffusion from an adjacent layer, such as the p-side cap layer at $5\times10^{16}/cm^3$.

The temperature is set to 1050° C., and an A layer composed of undoped $Al_{0.2}Ga_{0.8}N$ (25 Å thick) is grown using TMA for the raw material, and then a B layer composed of GaN doped with Mg at $1\times10^{19}/cm^3$ (25 Å thick) is laminated using a $Cp_2Mg$ gas for an impurity gas. The A layer and the B layer are alternately laminated, and this process is repeated to grow an p-side clad layer composed of a multilayer film (superlattice structure) with a total thickness of 0.6 μm.

Finally, a p-side contact layer composed of GaN doped with Mg at $1\times10^{20}/cm^3$ (150 Å thick) is grown on the p-side clad layer.

Formation of Ridge 14

The resulting wafer on which the nitride semiconductor has been grown is taken out of the reaction vessel, and a protective film composed of $SiO_2$ is formed as a stripe with a width of 2.0 μm on the surface of the p-side contact layer (the outermost layer) via a mask of a specific shape. After this, RIE is used to etch down to near the interface between the p-side clad layer and the p-side optical guide layer, and if desired, wet etching (surface treatment) using acidic solution (e.g., mixture solution of phosphoric acid and sulfuric acid) is performed to form a stripe-like ridge 14 with a width of 2.0 μm.

Formation of Insulating Protective Film 15

Next, with the $SiO_2$ mask still in place, an $Al_2O_3$ film is formed as the first film 15b in a thickness of 200 Å on the surface of the nitride semiconductor layer with an ECR plasma sputtering apparatus, using an aluminum target, and at a microwave power of 500 W, an RF power of 500 W, an argon flow of 20 sccm, and an oxygen flow of 15 sccm.

Figure 2A:
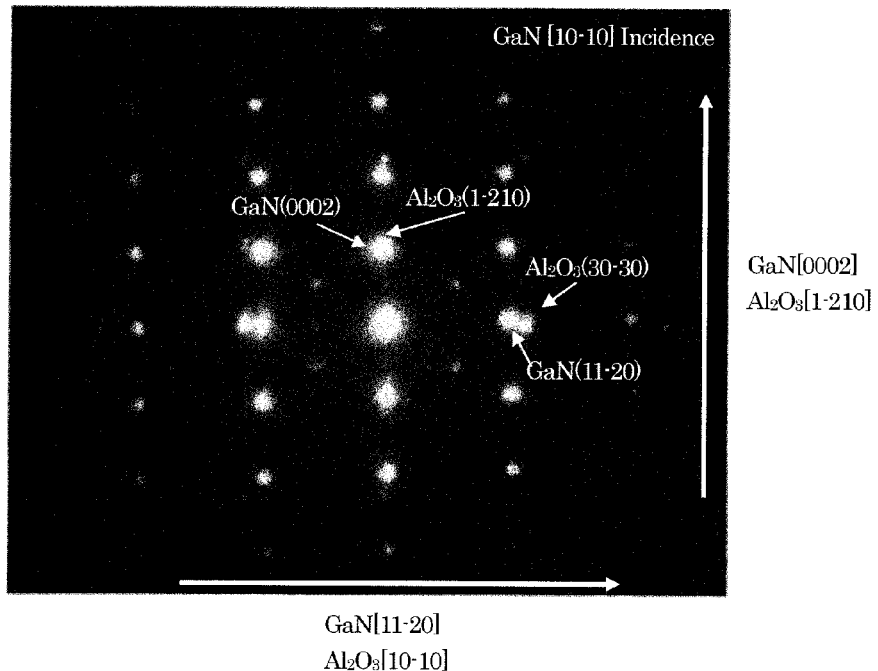
FIGS. 2A, 2B and 2C are electron beam diffraction images of the first film observing from the top face.
Figure 2B:
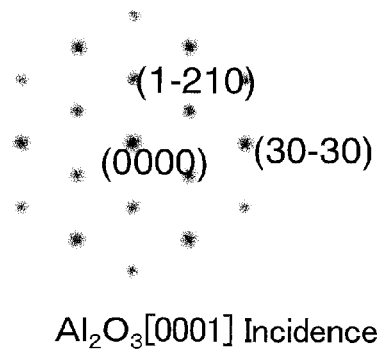
Figure 2C:
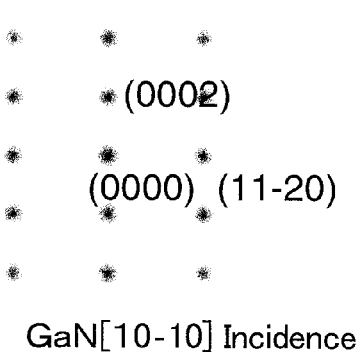

The interface between the GaN and the $Al_2O_3$ film thus formed was irradiated with an electron beam to the GaN (10-10) plane direction, whereupon the diffraction image in FIG. 2A was obtained. The diffraction points were in a regular arrangement. The results in FIGS. 2B and 2C of simulating $Al_2O_3$ and GaN electron beam diffraction images show that the diffraction points in FIG. 2A can be separated into electron beam diffraction points incident on $Al_2O_3$ single crystals (0001) and electron beam diffraction points incident on GaN (10-10). This confirmed that the $Al_2O_3$ film was in a monocrystalline state on the C-plane GaN, and that the orientation was GaN [0002]//$Al_2O_3$ [1-210], GaN [11-20]//$Al_2O_3$ [10-10], that is, that the film had A axis orientation and M axis orientation. The crystallized $Al_2O_3$ film had little absorption, adhered well to GaN, and functioned as part of an extremely stable insulating protective film.

Next, a $ZrO_2$ film is formed as the second film 15a in a thickness of 2000 Å on the surface of the first film 15b with an ECR plasma sputtering apparatus, using a Zn target, and at a microwave power of 500 W, an RF power of 500 W, an argon flow of 20 sccm, and an oxygen flow of 5 sccm.

Figure 3:
FIG. 3 is electron beam diffraction image of the second film observing from the top face.

As shown in the electron diffraction image of FIG. 3, the $ZrO_2$ film thus obtained did have diffraction points, but they were sparse, and it was confirmed that the film had been formed in a polycrystalline state.

After this, annealing was performed at 400° C. or higher, then this product was dipped in buffered hydrofluoric acid to dissolve away the $SiO_2$ that had been formed on the p-side contact layer, and the $Al_2O_3$ film and the $ZrO_2$ film on the p-side contact layer were removed along with the $SiO_2$ by lift-off.

Electrode Formation

Next, a $SiO_2$ mask was formed on the ridge surface, and RIE etching was performed to expose the surface of the n-side contact layer.

The p-side electrode 16 was formed as a stripe by forming first nickel and then gold on the outermost ridge surface of the p-side contact layer. Meanwhile, the n-side electrode 19 was formed as a stripe on the already exposed n-side contact layer by forming first titanium and then aluminum.

Formation of Protective Film 17

The protective film 17 composed of $SiO_2$ was formed on the surface of the nitride semiconductor layer exposed between the p-side electrode 16 and the n-side electrode 19.

Pad Electrode Formation

An n-side pad electrode (not shown) electrically connected to the n-side electrode 19, and the p-side pad electrode 18 electrically connected to the p-side electrode 16 via the protective film 17, were formed.

Cleaving

After this, the substrate 10 was cleaved into bars, and cavity planes were produced on the cleavage planes of these bars. After the cavity plane production, the bar-shaped wafers were cut perpendicular to the cavity planes to obtain laser chips.

Evaluation

The electrodes on each of the semiconductor laser chips thus obtained were wire bonded, and the laser oscillation was tested at room temperature, whereupon the desired optical confinement was attained, it was confirmed that continuous oscillation occurred at an oscillation wavelength of 405 nm and a threshold current density of 3 kA/cm$^2$ at room temperature, and a service life of over 1000 hours was exhibited.

Example 2

As shown in FIG. 1B, the semiconductor laser element in this example had substantially the same configuration as the semiconductor laser element in Example 1, except that a first film (a monocrystalline Al$_2$O$_3$ film) and a second film (amorphous ZrO$_2$) were formed as an insulating protective film, and the n-side electrode 19 was formed on the second main face of the substrate 10.

First, a substrate doped with n-type impurities is readied. This substrate in which the first plane serves as the growth plane is conveyed into an MOVPE reaction vessel. A first buffer layer composed of n-Al$_{0.02}$Ga$_{0.98}$N doped with Si at $1.8 \times 10^{18}$/cm$^3$ (2 µm thick) is grown using TMA, TMG and NH$_3$ as the raw material gas with a silane gas for an impurity gas. Nest, the temperature is rose, a second buffer layer composed of n-In$_{0.05}$Ga$_{0.95}$N doped with Si at $3 \times 10^{18}$/cm$^3$ (1500 Å thick) is grown using TMI, TMG, and NH$_3$ for the raw material gas with a silane gas for an impurity gas.

Thereafter, a clad layer composed of Al$_{0.11}$Ga$_{0.89}$N doped with Si at $1 \times 10^{18}$/cm$^3$ (0.7 µm thick) is grown using NH$_3$, TMA, and TMG for the raw material gas with a silane gas for an impurity gas. No fine cracks developed in the n-side clad layer, which means that an element structure with a good crystallinity can be grown.

Next, an n-side wave guide layer composed of undoped Al$_{0.06}$Ga$_{0.94}$N (0.15 µm thick) is grown using TMA, TMG and ammonia for the raw material at the same temperature.

The temperature is set to 950° C., a barrier layer composed of Al$_{0.15}$Ga$_{0.85}$N doped with Si at $5 \times 10^{18}$/cm$^3$ (70 Å thick) using NH$_3$, TMA, and TMG for the raw material gas with a silane gas for an impurity gas. The silane gas is stopped, a well layer composed of undoped In$_{0.01}$Ga$_{0.09}$N (100 Å thick) are laminated on the barrier layer using NH$_3$, TMI, and TMG for the raw material gas. And then, a barrier layer composed of Al$_{0.15}$Ga$_{0.85}$N (50 Å thick) is grown using TMA, TMG for the raw material at the same temperature to grow an active layer composed of a single quantum well structure (SQW).

A p-side cap layer composed of p-Al$_{0.30}$Ga$_{0.70}$N doped with Mg at $1 \times 10^{20}$/cm$^3$ (100 Å thick) is grown on the active layer using NH$_3$, TMA, and TMG for the raw material gas with Cp$_2$Mg, and then Cp$_2$Mg is stopped, a p-side wave guide layer composed of undoped Al$_{0.06}$Ga$_{0.94}$N (0.15 µm thick) is grown. This p-side wave guide layer is undoped layer, but magnesium may be included by diffusion from an adjacent layer, such as the p-side cap layer at $5 \times 10^{16}$/cm$^3$.

The temperature is set to 1050° C., and an A layer composed of undoped Al$_{0.13}$Ga$_{0.87}$N (25 Å thick) is grown, and then a B layer composed of Al$_{0.09}$Ga$_{0.91}$N doped with Mg at $1 \times 10^{19}$/cm$^3$ (25 Å thick) is laminated using a Cp$_2$Mg gas for an impurity gas. The A layer and the B layer are alternately laminated, and this process is repeated to grow an p-side clad layer composed of a multilayer film (superlattice structure) with a total thickness of 0.6 µm.

Finally, a p-side contact layer composed of GaN doped with Mg at $1 \times 10^{20}$/cm$^3$ (150 Å thick) is grown on the p-side clad layer.

After that, a stripe-like ridge is formed in the same manner as in Example 1.

Also, an insulating protective film composed of a first film (monocrystalline Al$_2$O$_3$ film) and second film (amorphous ZrO$_2$ film) is formed in the same manner as in Example 1.

Next, n-side electrode 19 is formed on the second plane of the substrate 10.

With this laser element, the GaN substrate was cleaved at the M plane (when the nitride semiconductor is expressed as hexagonal prisms, this plane corresponds to the side faces of the hexagonal prisms), and cavity planes were produced on the cleavage planes of these bars. After the cavity plane production, the bar-shaped wafers were cut perpendicular to the cavity planes to obtain laser chips.

It was confirmed by electron beam diffraction image that the first film was a monocrystalline Al$_2$O$_3$ film, and that the second film was amorphous ZrO$_2$.

Evaluation

The electrodes on each of the semiconductor laser chips thus obtained were wire bonded, and the laser oscillation was tested at room temperature, whereupon the desired optical confinement was attained, it was confirmed that continuous oscillation occurred at an oscillation wavelength of 375 nm and a threshold current density of 3 kA/cm$^2$ at room temperature, and a service life of over 5000 hours was exhibited.

Figure 4:
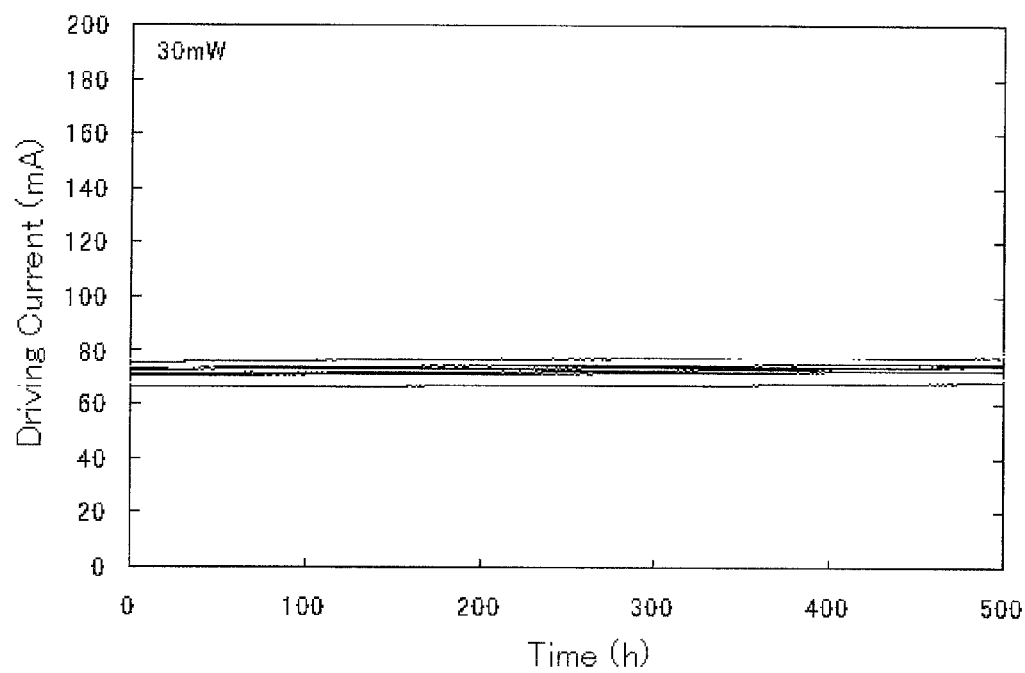
FIG. 4 is a graph illustrating the relation of driving current and time of the laser element in an example.

Ten semiconductor laser chips that were all the same were formed by the same method as discussed above, and these were continuously oscillated in the same manner, the results of which are given in FIG. 4. It can be seen in FIG. 4 that the drive current remained stable over an extended period for all of the chips.

Figure 5:
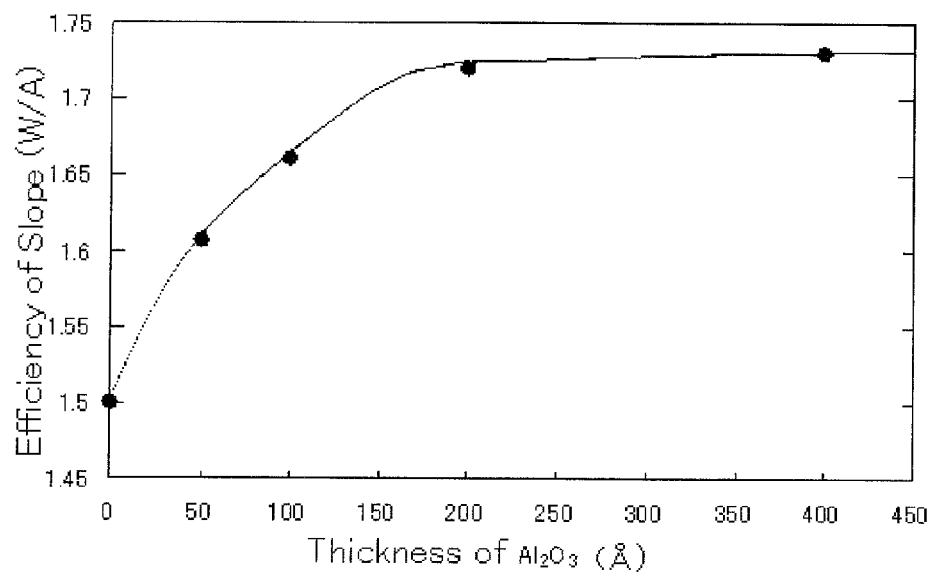
FIG. 5 is a graph illustrating the characteristic with respect to the thickness of the insulating protective film of the laser element in an example.

To measure the change in characteristics versus a change in the thickness of the first film and second film of the insulating protective film, the thickness in which the monocrystalline Al$_2$O$_3$ film serving as the first film was formed on the surface of the above-mentioned p-side nitride semiconductor composed of GaN was varied while the total thickness of the insulating protective film was fixed at 2000 Å, for example. These results are given in FIG. 5. It can be seen in FIG. 5 that the slope efficiency (output versus applied current; IL characteristic) increases along with the thickness of the monocrystalline Al$_2$O$_3$ film, and that a plateau is reached at a total thickness of about 10%, which confirms that it is good for the thickness to be about 5 to 20%, and especially about 7 to 15%, of the thickness of the insulating protective film.

Example 3

The semiconductor laser element of this example had substantially the same configuration as in Example 2, except that an insulating protective film composed of a first film (monocrystalline Al$_2$O$_3$ film) and second film (amorphous SiO$_2$ film) is formed.

A condition of the first film formation is set as the same as Example 2, and a condition of the second film formation is set at a microwave power of 500 W, an RF power of 500 W, an argon flow of 20 sccm, and an oxygen flow of 6 sccm to obtain the SiO$_2$ film (1500 Å thick).

This yielded substantially the same results as in Example 2.

Example 4

The semiconductor laser element of this example had substantially the same configuration as in Example 1, except that an insulating protective film composed of a first film (monocrystalline AlN film) and second film (amorphous $ZrO_2$ film) is formed.

A condition of the first film formation is set at a microwave power of 500 W, an RF power of 500 W, an argon flow of 20 sccm, and a nitrogen flow of 10 sccm to obtain the AlN film (200 Å thick), and a condition of the second film formation is set as the same as Example 2 to obtain the $ZrO_2$ film (1800 Å thick).

This yielded substantially the same results as in Example 1.

Example 5

The semiconductor laser element of this example had substantially the same configuration as in Example 1, except that an insulating protective film composed of a first film (monocrystalline AlN film: 200 Å thick) and second film (amorphous $SiO_2$ film: 1500 Å thick) is formed.

This yielded substantially the same results as in Example 1.

Example 6

The semiconductor laser element of this example had substantially the same configuration as in Example 2, except that a GaN substrate in the form of a wafer whose main plane was the C plane was used as the substrate. This GaN substrate comprised a region of high dislocation density with a width of 50 μm or less, and a region of low dislocation density with a width of 200 μm or more, with these regions arranged as alternating stripes.

This yielded substantially the same results as in Example 2.

Example 7

The semiconductor laser element of this example had substantially the same configuration as in Example 2, except that the substrate was a GaN substrate in the form of a wafer whose main plane was the C plane, and a recess was formed in the surface of this substrate.

This GaN substrate comprised a region of high dislocation density with a width of 50 μm or less, and a region of low dislocation density with a width of 200 μm or more, with these regions arranged as alternating stripes.

Also, a recess was formed in the surface over the region of the GaN substrate with high dislocation density. This recess can be formed as follows. First, for example, a mask pattern composed of $SiO_2$ is formed over the GaN substrate. This mask pattern is disposed so as to mask the region of low dislocation density and leave open the region of high dislocation density. After this, etching is performed with $Cl_2$ gas using RIE (reactive ion etching), forming a recess with a width of 60 μm and a depth of 2.5 μm. The side faces of the recess are at least 5 μm away from the edges of the region of high dislocation density.

This yielded substantially the same results as in Example 2.

Comparative Example 1

The semiconductor laser element of this comparative example had substantially the same configuration as in Example 1, except that an insulating protective film composed of a monolayer film (monocrystalline $Al_2O_3$ film).

A condition of the film formation is set at a microwave power of 500 W, an RF power of 500 W, an argon flow of 20 sccm, and an oxygen flow of 15 sccm to obtain the $Al_2O_3$ film (2000 Å thick).

Figure 6:
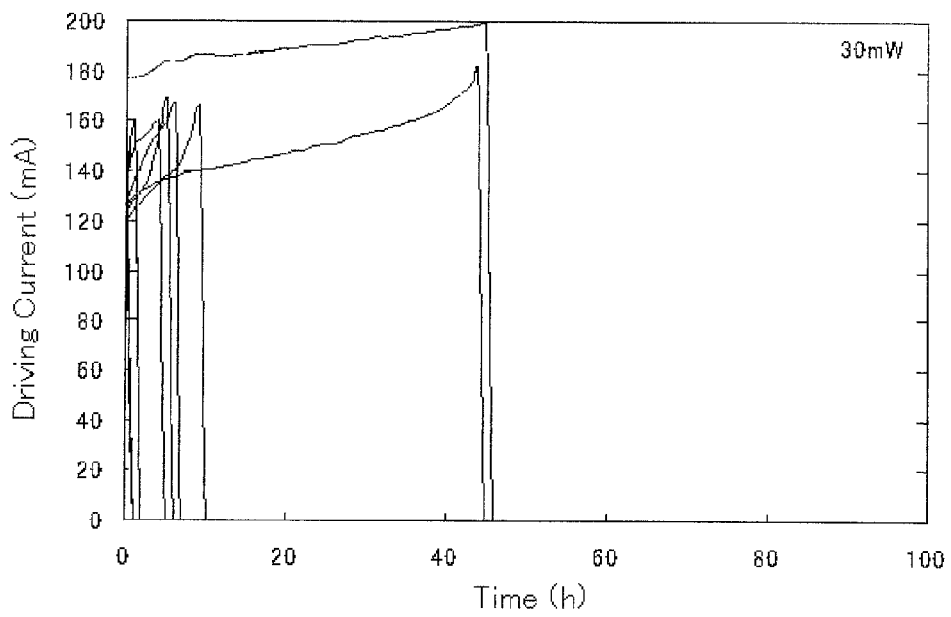
FIG. 6 is a graph illustrating the relation of driving current and time of the laser element in a comparative example.

It was confirmed from FIG. 6 that sudden breakage resulted in abrupt deterioration of drive current in all of the chips. The cause of this was chip cracking.

Comparative Example 2

The semiconductor laser element of this example had substantially the same configuration as in Example 1, except that an insulating protective film composed of a first film (monocrystalline $Al_2O_3$ film) and second film (polycrystalline $Al_2O_3$ film) is formed.

A condition of the first film formation is set at a microwave power of 500 W, an RF power of 500 W, an argon flow of 20 sccm, and an oxygen flow of 15 sccm to obtain the $Al_2O_3$ film (1000 Å thick). A condition of the second film formation is set at a microwave power of 500 W, an RF power of 500 W, an argon flow of 20 sccm, and an oxygen flow of 6 sccm to obtain the $Al_2O_3$ film (1000 Å thick).

When the laser element was evaluated in the same manner as in Example 1, it was confirmed that sudden breakage resulted in abrupt deterioration of drive current. The cause of this was cracking, because the first and second films were both made of the same material, and the second film underwent single crystallization.

Comparative Example 3

The semiconductor laser element of this comparative example had substantially the same configuration as in Example 1, except that an insulating protective film composed of a monolayer film (amorphous $ZrO_2$ film).

The laser element was evaluated in the same manner as in Example 1. This result is given in FIG. 7.

Figure 7:
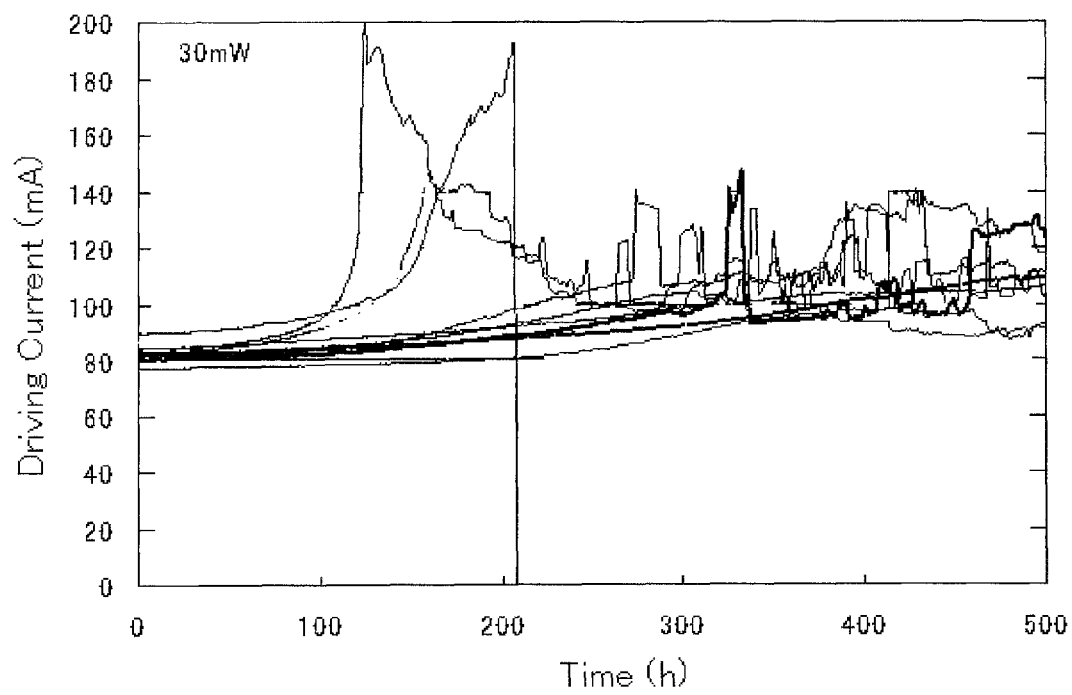
FIG. 7 is a graph illustrating the relation of driving current and time of the laser element in another comparative example.

It was confirmed from FIG. 7 that the drive current was unstable over an extended period, and that when the oscillation time was extended, drive current fluctuated wildly. The occurrence of sudden breakage was also noted. The cause of all this was either lifting of the insulating protective film, or cracking of the nitride semiconductor layer, which led to chip cracking.

The present invention can be utilized a nitride semiconductor element which needs to ensure adhesive between a film composed of the material as the same as the material of, e.g., an embedded film, and the material of the electrode, such as light emitting elements (e.g., LD, LED, super luminescence diode, etc.), solar cells, light-receptive elements (e.g., light sensor, etc.), electric devices (e.g., transistor, power device, etc.) and the like. In particular, it is useful as an excitation light source or the like for nitride semiconductor elements in optical disk applications, optical communications systems, display, printers, optical exposure applications, and various devices for measurement, bio-specific applications and the like.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing description of the embodiments according to the present invention is provided for illustration only, and not for the purpose of limiting the invention as defined by the appended claims and their equivalents.

What is claimed is:

1. A method for manufacturing a nitride semiconductor laser element comprising a substrate, a nitride semiconductor layer that is laminated on the substrate and that has a ridge on its surface, an insulating protective film, and an electrode that is electrically connected with the nitride semiconductor layer, wherein the nitride semiconductor layer includes an n-side semiconductor layer, an active layer and an p-side semiconductor layer laminated on the substrate, the method comprising:

forming the ridge;

forming a monocrystalline first film from side faces of the ridge to a top face of the nitride semiconductor layer on both sides of the ridge, the first film being one of AlN and $Al_2O_3$ containing hexagonal crystals;

forming a second film containing polycrystalline or an amorphous substance above the nitride semiconductor layer and over the first film thereby forming the insulating protective film, the second film being one of ZrO and $SiO_2$; and forming an additional protective film containing an amorphous substance on side faces of the nitride semiconductor layer, the additional protective film being made of material different from material of the first film or material of the second film the forming of the additional protective film including forming the additional protective film to be in direct contact with the side faces of the nitride semiconductor layer.

2. The method according to claim 1, wherein said forming of the ridge is performed by RIE method.

3. The method according to claim 1, wherein the first film is an A-axially-orientated film.

4. The method according to claim 1, wherein the first film is thinner than the second film.

5. The method according to claim 1, wherein the first film is $Al_2O_3$.

6. The method according to claim 1, wherein the first film has a thickness of 100 nm or less.

7. The method according to claim 1, wherein the insulating protective film has the total thickness of 100 to 500 nm, and the first film has the thickness of 100 nm or less.

8. The method according to claim 1, wherein the insulating protective film is formed by a combination of two of the following methods: vapor deposition, sputtering, reactive sputtering, Electron Cyclotron Resonance plasma sputtering, magnetron sputtering, ion beam assist deposition, ion plating, laser ablation, Chemical Vapor Deposition, spraying, spin coating, dipping or a combination thereof.

9. The method according to claim 1, wherein at least the first film is formed by Electron Cyclotron Resonance plasma sputtering.

10. A method for manufacturing a nitride semiconductor laser element comprising a substrate, a nitride semiconductor layer that is laminated on the substrate and that has a ridge on its surface, an insulating protective film, and an electrode that is electrically connected with the nitride semiconductor layer, wherein the nitride semiconductor layer includes an n-side semiconductor layer, an active layer and an p-side semiconductor layer laminated on the substrate, the method comprising:

forming the ridge;

forming a monocrystalline first film from side faces of the ridge to a top face of the nitride semiconductor layer on both sides of the ridge using ECR in an oxygen flow at a first flow rate, the first film being one of AlN and $Al_2O_3$ containing hexagonal crystals;

forming a second film containing polycrystalline or an amorphous substance using ECR in an oxygen flow at a second flow rate that is less than the first flow rate, above the nitride semiconductor layer and over the first film thereby forming the insulating protective film; and forming an additional protective film containing an amorphous substance on side faces of the nitride semiconductor layer, the additional protective film being made of material different from material of the first film or material of the second film, the forming of the additional protective film including forming the additional protective film to be in direct contact with the side faces of the nitride semiconductor layer.

11. The method according to claim 10, wherein the forming of the first film is performed in an oxygen flow rate of between 10 and 20 sccm.

12. The method according to claim 11, wherein the forming of the second film is performed in an oxygen flow rate of between 3 and 8 sccm.

13. The method according to claim 10, wherein the first film is $Al_2O_3$ and the first film has a thickness that is less than a thickness of the second film.

14. The method according to claim 13, wherein the second film is formed directly onto the first film.

15. A method for manufacturing a nitride semiconductor laser element comprising a substrate, a nitride semiconductor layer that is laminated on the substrate and that has a ridge on its surface, an insulating protective film, and an electrode that is electrically connected with the nitride semiconductor layer, wherein the nitride semiconductor layer includes an n-side semiconductor layer, an active layer and an p-side semiconductor layer laminated on the substrate, the method comprising:

forming the ridge;

forming a monocrystalline first film from side faces of the ridge to a top face of the nitride semiconductor layer on both sides of the ridge, the first film being one of AlN and $Al_2O_3$ containing hexagonal crystals;

forming a second film containing polycrystalline or an amorphous substance above the nitride semiconductor layer and directly onto the first film thereby forming the insulating protective film, the first film having a thickness that is less than a thickness of the second film; and forming an additional protective film containing an amorphous substance on side faces of the nitride semiconductor layer, the additional protective film being made of material different from material of the first film or material of the second film, the forming of the additional protective film including forming the additional protective film to be in direct contact with the side faces of the nitride semiconductor layer.

16. The method according to claim 15, wherein the first film is an A-axially-orientated film.

17. The method according to claim 15, wherein the first film is $Al_2O_3$.

18. The method according to claim 17, wherein the insulating protective film consists only of the first film and the second film.

* * * * *